(12) United States Patent
Park

(10) Patent No.: US 9,685,629 B2
(45) Date of Patent: Jun. 20, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Dong-Seop Park, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/808,086

(22) Filed: Jul. 24, 2015

(65) Prior Publication Data

US 2016/0254476 A1 Sep. 1, 2016

(30) Foreign Application Priority Data

Feb. 26, 2015 (KR) .................... 10-2015-0027321

(51) Int. Cl.
*H01L 51/52* (2006.01)
*H01L 27/32* (2006.01)

(52) U.S. Cl.
CPC ........ *H01L 51/525* (2013.01); *H01L 27/3211* (2013.01); *H01L 27/3246* (2013.01)

(58) Field of Classification Search
CPC ............ H01L 51/0545; H01L 51/0036; H01L 51/0541; H01L 51/5012
See application file for complete search history.

(56) References Cited

U.S. PATENT DOCUMENTS 8,441,188 B2 * 5/2013 Lee .................. H01L 51/525
313/507
2013/0277649 A1 10/2013 Gregory et al.

FOREIGN PATENT DOCUMENTS

| JP | 2004-319118 A | 11/2004 |
| KR | 10-2010-0003243 A | 1/2010 |
| KR | 10-2011-0008958 A | 1/2011 |

* cited by examiner

*Primary Examiner* — Quoc Hoang
(74) *Attorney, Agent, or Firm* — Lee & Morse P.C.

(57) ABSTRACT

An organic light emitting diode (OLED) display includes two or more spacers on a substrate, the two or more spacers being arranged at least at either one of a center point of a virtual quadrangle or a vicinity of the center point of the virtual quadrangle, an electrode portion at each apex of the virtual quadrangle, the electrode portion surrounding the two or more spacers, and a pixel definition layer on the electrode portion, the pixel definition layer including exposing the electrode portion.

20 Claims, 10 Drawing Sheets

ORGANIC LIGHT EMITTING DIODE DISPLAY

CROSS-REFERENCE TO RELATED APPLICATION

Korean Patent Application No. 10-2015-0027321, filed on Feb. 26, 2015, in the Korean Intellectual Property Office, and entitled: "Organic Light Emitting Diode Display," is incorporated by reference herein in its entirety.

BACKGROUND

1. Field

The described technology relates generally to a layout of spacers in an organic light emitting diode (OLED) display, and more particularly, to an OLED display including shapes and arrangements of spacers disposed on a pixel definition layer.

2. Description of the Related Art

Recently, an organic light emitting diode (OLED) display is receiving attention as a display device for displaying an image. Unlike a liquid crystal display (LCD), the OLED display has a self-luminance characteristic and does not require an additional light source, so thickness and weight thereof can be reduced. In addition, the OLED display represents high quality characteristics, such as low power consumption, high luminance, and high response speed.

Generally, the OLED display includes a first substrate, a first electrode positioned on a first substrate, a pixel definition layer including an opening through which the first electrode is exposed, an organic emission layer positioned on the first electrode to correspond to the opening, a second electrode positioned on the organic emission layer, and a second substrate positioned on the second electrode. Recently, an OLED display which further includes spacers has been developed.

SUMMARY

An exemplary embodiment provides an organic light emitting diode (OLED) display including two or more spacers on a substrate, the two or more spacers being arranged at least at either one of a center point of a virtual quadrangle or a vicinity of the center point of the virtual quadrangle, an electrode portion at each apex of the virtual quadrangle, the electrode portion surrounding the two or more spacers, and a pixel definition layer on the electrode portion, the pixel definition layer including exposing the electrode portion.

The electrode portion may include a first electrode positioned at a first apex of the virtual quadrangle, a second electrode positioned at the first apex that is separated from a second apex of the virtual quadrangle while interposing the center point of the virtual quadrangle therebetween, a third electrode positioned at a third apex of the virtual quadrangle, and a fourth electrode positioned at a fourth apex of the virtual quadrangle that is separated from the third apex while interposing the center point of the virtual quadrangle therebetween.

The two or more spacers may be formed to protrude in an island-like shape from the pixel definition layer.

Each of the two or more spacers may have a planar bar shape.

Each of the two or more spacers may have a triangular planar shape.

Each of the two or more spacers may have a planar shape with a comb-like pattern.

The two or more spacers may be disposed to be symmetrical to each other based on the center point of the virtual quadrangle.

The two or more spacers may be disposed to be symmetrical to each other based on a first imaginary line that connects the first apex and the second apex.

The two or more spacers may be disposed to be symmetrical to each other based on a second imaginary line that connects the third apex and the fourth apex.

The pixel definition layer may include: a first opening of a first polygonal shape configured to open the first electrode and to have a center coinciding with the first apex; a second opening of a second polygonal shape configured to open the second electrode and to have a center coinciding with the second apex; and a pair of third openings of a third polygonal shape respectively configured to open the third and fourth electrodes and to have centers coinciding with the third apex and the fourth apex.

The first and second openings may have larger sizes than the pair of third openings.

The second opening may have a larger size than the first opening.

One or more of the first, second, and third polygons may be octagons.

Either one of the first polygon and the second polygon may be a quadrangle, the other one may be a hexagon, and the third polygon may be an octagon.

A plurality of first openings may be provided, and the neighboring ones of the plurality of first openings may have quadrangular shapes that are symmetrical to each other.

A distance between the first and second openings may be identical to that between the neighboring third openings.

A distance between the first opening and either one of the pair of third openings may be identical to that between the second opening and either one of the pair of third openings.

The OLED display may further include: a first organic emission layer disposed on the first electrode in accordance with the first opening; a second organic emission layer disposed on the second opening in accordance with the second electrode; and a pair of third organic emission layer respectively disposed on the third and fourth electrodes in accordance with the pair of third openings.

The first organic emission layer, the second organic emission layer, and the pair of third organic emission layers may emit light of different colors.

Either one of the first organic emission layer and the second organic emission layer emits red light, the other emits blue light, and the pair of third organic emission layers emit green light.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
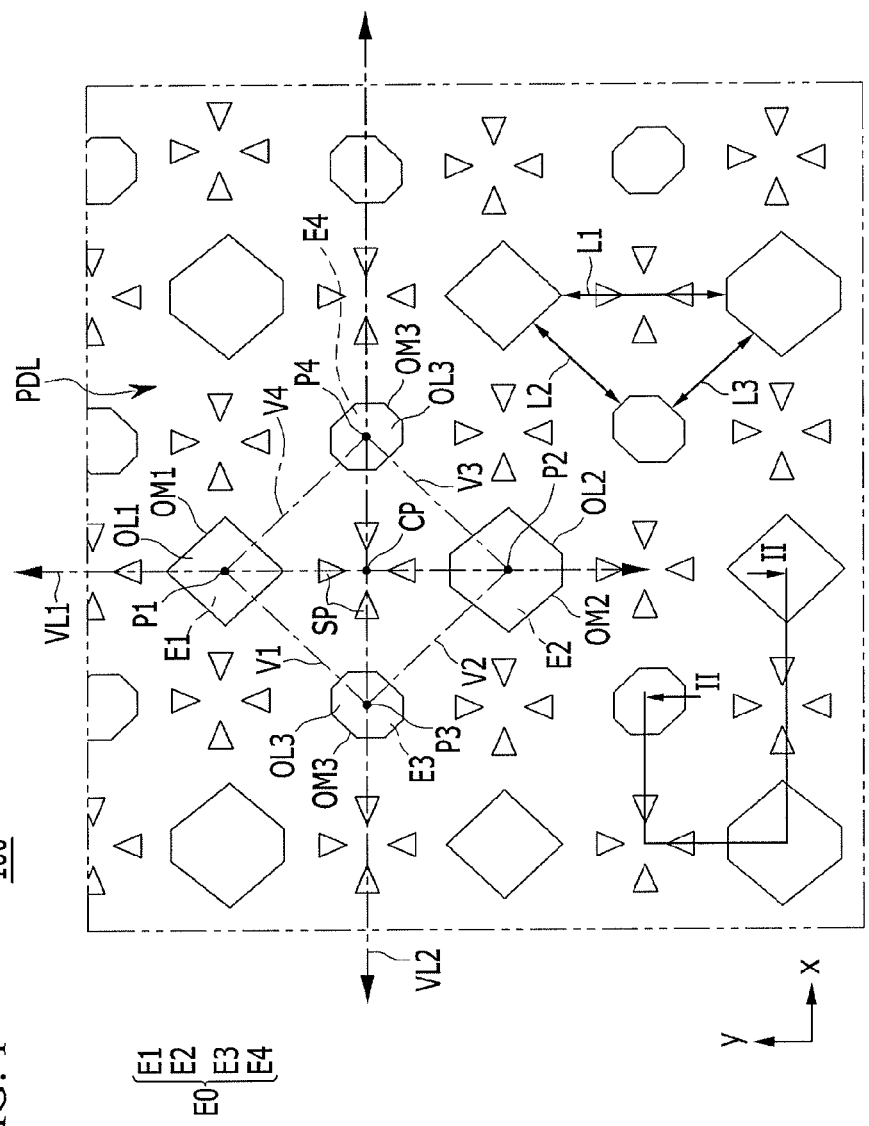
FIG. 1 illustrates part of a plane of an organic light emitting diode (OLED) display according to an exemplary embodiment.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology. The drawings and description are to be regarded as illustrative in nature and not restrictive. Like reference numerals designate like elements throughout the specification.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

Meanwhile, the term "on" as used in the described technology means that one element is disposed above or below a target element, but does not necessarily mean that no other element is disposed above such based on the direction of gravity. Further, in the drawings, size and thickness of each element are illustrated for ease of description, and the described technology is not necessarily limited to such size and thickness illustrated in the drawings.

In addition, unless explicitly described to the contrary, the word "comprise" and variations such as "comprises" or "comprising", will be understood to imply the inclusion of stated elements, but not the exclusion of any other elements.

An organic light emitting diode (OLED) display according to an exemplary embodiment will now be described with reference to FIGS. 1 and 2.

Figure 2:
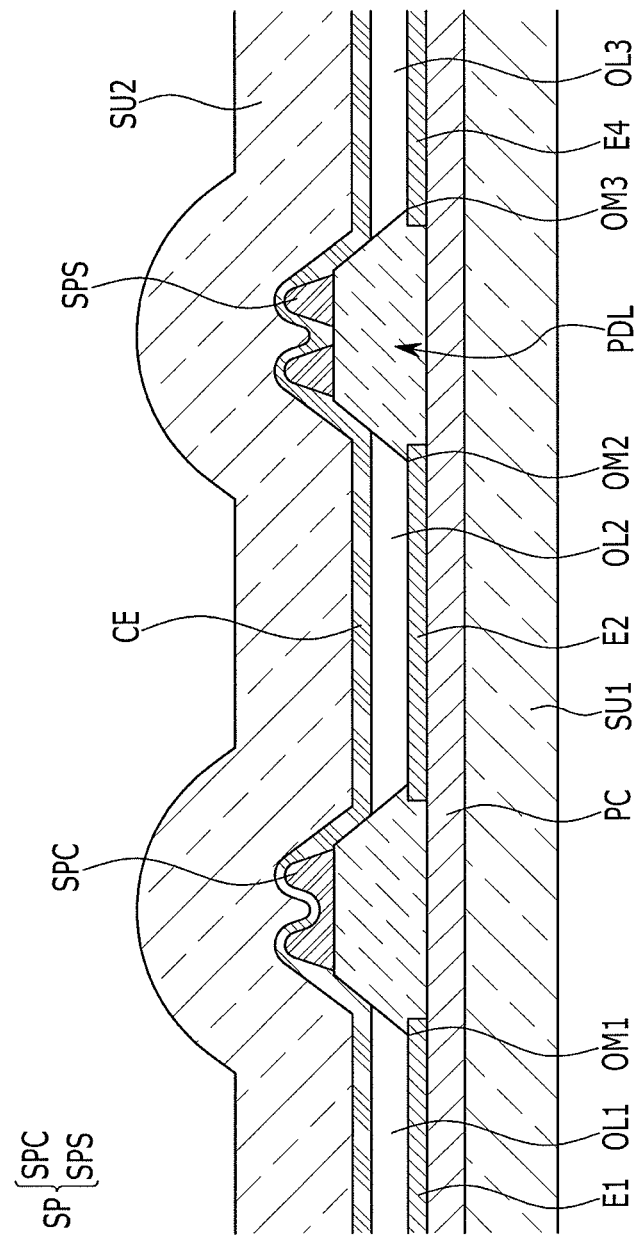
FIG. 2 illustrates a cross-sectional view of FIG. 1 taken along the line II-II.

FIG. 1 illustrates part of a plane of an OLED display according to an exemplary embodiment, and FIG. 2 is a cross-sectional view of FIG. 1 taken along the line II-II.

As shown in FIGS. 1 and 2, an OLED display 100 according to an exemplary embodiment may include a first substrate SU1, a circuit unit PC, an electrode portion E0 including first, second, third, and fourth electrodes E1, E2, E3, and E4, a pixel definition layer PDL, a first organic emission layer OL1, a second organic emission layer OL2, a third organic emission layer OL3, two or more spacers SP, a common electrode CE, and a second substrate SU2.

The substrate SUB may be an insulating substrate that is made of, e.g., glass, quartz, ceramic, metal, and plastic. For example, when the first substrate SU1 is made of plastic and the like, the OLED display may exhibit a flexible, stretchable, or rollable property.

The circuit unit PC may include wires, which are disposed on the first substrate SU1 and include one or more of scan, data, driving power, and common power lines, and a pixel circuit, e.g., two or more thin film transistors (TFTs) and at least one capacitor that are connected to the wires in accordance with one pixel. The circuit unit PC may be formed to have various kinds of structures that are disclosed.

The electrode portion E0 is positioned on the circuit unit PC, and is connected to the TFTs of the circuit unit PC. The electrode portion E0 may include the electrodes that are positioned at each apex of a virtual quadrangle (VT). In this case, as illustrated in FIG. 1, the virtual quadrangle (VT) includes a center point CP, a first apex P1, a second apex P2, a third apex P3, a fourth apex P4, a first side V1, a second side V2, a third side V3, and a fourth side V4.

The first electrode E1 is positioned on the circuit unit PC, and is connected to the TFTs of the circuit unit PC. A center region of the first electrode E1 is positioned at the first apex P1 of the virtual quadrangle (VT).

In detail, the first side V1 of the virtual quadrangle (VT) interconnects the first apex P1 and the third apex P3, the second side V2 interconnects the third apex P3 and the second apex P2, the third side V3 interconnects the second apex P2 and the fourth apex P4, and the fourth side V4 interconnects the fourth apex P4 and the first apex P1. In addition, the first and second apexes P1 and P2 of the virtual quadrangle (VT) are separated from each other while interposing the center point CP therebetween, the third and fourth apexes and P3 and P4 are separated from each other while interposing the center point CP therebetween, and the third and fourth apexes P3 and P4 are positioned to neighbor the first and second apexes P1 and P2, respectively.

The first electrode E1 may have various polygonal shapes, and the center region of the first electrode E1 is opened by a first opening OM1 of the pixel definition layer PDL.

The second electrode E2 is positioned on the circuit unit PC, and is separated from the first electrode E1. The second electrode E2 is connected to the TFTs of the circuit unit PC. A plurality of second electrodes E2 are provided, and the plurality of second electrodes E2 are separated from each other while respectively interposing the first electrode E1 therebetween, e.g., one first electrode E1 may be positioned between two second electrodes E2 adjacent to each other along each of an x-axis and a y-axis (FIG. 1). A center region of each of the second electrodes E2 is positioned at the second apex P2 of the virtual quadrangle (VT). The second electrode E2 may have various polygonal shapes, and a center region of the second electrode E2 is opened by a second opening OM2 of the pixel definition layer PDL.

The third electrode E3 is positioned on the circuit unit PC while being separated from each of the first and second electrodes E1 and E2. The third electrode E3 is connected to the TFTs of the circuit unit PC. A plurality of third electrodes E3 are provided, and the plurality of third electrodes E3 are separated from each other while respectively interposing the first electrode E1 therebetween, e.g., one first electrode E1 may be positioned between two third electrodes E3 adjacent to each other along a direction at an oblique angle, e.g., diagonal, with respect to the x-axis and the y-axis (FIG. 1). A center region of each of the third electrodes E3 is positioned at the third apex P3 of the virtual quadrangle (VT). The third electrode E3 may have various polygonal shapes, and a center region of the third electrode E3 is opened by a third opening OM3 of the pixel definition layer PDL.

The fourth electrode E4 is positioned on the circuit unit PC, and is separated from each of the first, second, and third electrodes E1, E2, and E3. A plurality of fourth electrodes E4 are provided, and the plurality of fourth electrodes E4 are separated from each other while respectively interposing the third electrode E3 therebetween, e.g., along the x-axis and the y-axis. The fourth electrodes E4 are connected to the TFTs of the circuit unit PC. A center region of each of the fourth electrodes E4 is positioned at the fourth apex P4 of the virtual quadrangle (VT). The fourth electrodes E4 may have various polygonal shapes, and a center region of the fourth electrode E4 is opened by a third opening OM3 of the pixel definition layer PDL.

The first, second, third, and fourth electrodes E1, E2, E3 and E4 are positioned on the virtual quadrangle (VT) while interposing the center point CP of the virtual quadrangle (VT) therebetween. Each of the first, second, third, and fourth electrodes E1, E2, E3, and E4 is disposed in each virtual quadrangle (VT). Each of the first, second, third, and fourth electrodes E1, E2, E3, and E4 may be an anode serving as a hole injection electrode or a cathode. The first, second, third, and fourth electrodes E1, E2, E3, and E4 may be formed as a light transmissive electrode or a light reflective electrode.

The pixel definition layer PDL is positioned on each of the first, second, third, and fourth electrodes E1, E2, E3, and E4, and covers respective edges of the first, second, third, and fourth electrodes E1, E2, E3, and E4. The pixel definition layer PDL includes the first and second openings OM1 and OM2 that respectively open, e.g., expose, the first and second electrodes E1 and E2, and a pair of third openings OM3 that respectively open, e.g., expose, the third electrode E3 and the fourth electrode E4.

The first opening OM1 opens the first electrode E1, and has a first polygonal shape, e.g., a quadrangle. The first opening OM1 is separated from each of the third and second openings OM3 and OM2, with its center coinciding, e.g., aligning, with the first apex P1 of the virtual quadrangle (VT). The first opening OM1 has a larger size than the neighboring third openings OM3, while having a smaller size than the neighboring second opening OM2. The first opening OM1 has a quadrangular shape among polygonal shapes, but it is not limited thereto. For example, the first opening OM1 may have any polygonal shape, e.g., a triangular, pentagonal, hexagonal, heptagonal, or octagonal shape. A plurality of first openings OM1 are provided, and neighboring ones of the plurality of first openings OM1 have quadrangular shapes that are symmetrical to each other. Meanwhile, the plurality of first openings OM1 may have quadrangular shapes that are identical to each other. For example, the first organic emission layer OL1 emitting red light is disposed on the first electrode E1 that is opened by the first opening OM1. However, embodiments are not limited thereto, e.g., an organic emission layer emitting light of various colors, such as blue, red, and white, may be disposed on the first electrode E1 that is opened by the first opening OM1.

The second opening OM2 opens the second electrode E2, and has a second polygonal shape, e.g., a hexagon. The second opening OM2 is separated from each of the third opening OM3 and the first opening OM1, with its center coinciding with the second apex P2 of the virtual quadrangle (VT). That is, the plurality of second openings OM2 are separated from the first opening OM1 while interposing the center point CP of the virtual quadrangle (VT) therebetween, e.g., the center point CP of the virtual quadrangle (VT) may be between the first opening OM1 and the second opening OM2 along the y-axis. The second opening OM2 has a larger size than the neighboring first and third openings OM1 and OM3. The second opening OM2 has a hexagonal shape among polygonal shapes, but it is not limited thereto. For example, the second opening OM2 may have a polygonal shape, e.g., a triangular, quadrangular, pentagonal, heptagonal, or octagonal shape. For example, the second organic emission layer OL2 emitting blue light is disposed on the second electrode E2 that is opened by the second opening OM2. However, embodiments are not limited thereto, e.g., an organic emission layer emitting light of various colors, e.g., red, green, or white, may be disposed on the second electrode E2 that is opened by the second opening OM2.

A pair of third openings OM3 are formed in the virtual quadrangle to open the third and fourth electrodes E3 and E4, respectively, and have a third polygonal shape, e.g., an octagon. The third opening OM3 is separated from each of the first and second openings OM1 and OM2, with its center coinciding, e.g., aligning, with the third and fourth apexes P3 and P4 of the virtual quadrangle (VT), respectively. The third opening OM3 has a smaller size than each of the neighboring first and second opening OM1 and OM2. The third opening OM3 has an octagonal shape among polygonal shapes, but it is not limited thereto, e.g., may have a polygonal shape of a triangular, quadrangular, pentagonal, hexagonal, or heptagonal shape. A plurality of third openings OM3 are provided, and the plurality of third openings OM3 have octagonal shapes that are identical to each other. The plurality of third openings OM3 are separated from each other while interposing the center point CP of the virtual quadrangle (VT) therebetween. For example, the third organic emission layer OL3 emitting green light is disposed on the third and fourth electrodes E3 and E4 that are opened by the third openings OM3. However, embodiments are not limited thereto, e.g., an organic emission layer emitting light of various colors, such as blue, green, or white, may be disposed on the third and fourth electrodes E3 and E4 that are opened by the third openings OM3.

Meanwhile, one or more of the respective first, second, and third polygons of the first, second, and third openings OM1, OM2, and OM3 described above may have an octagonal shape.

The plurality of first, second, and third openings OM1, OM2, and OM3 are respectively provided. The plurality of first and second openings OM1 and OM2 are alternately arranged on the first imaginary line VL1, i.e., along the y-axis, that connects the first and second apexes P1 and P2. The plurality of third openings OM3 are sequentially arranged on the second imaginary line VL2, i.e., along the x-axis, that connects the third and fourth apexes P3 and P4.

For example, a distance between the first and second openings OM1 and OM2 may be identical to that between the two neighboring third openings OM3. That is, the virtual quadrangle (VT) may be a rectangle since two diagonal lines of the virtual quadrangle (VT) may have the same length. In addition, a distance between the first and third openings OM1 and OM3 may be identical to that between the second and third openings OM2 and OM3. That is, the virtual quadrangle (VT) may be a square since a length of the first side V1 of the virtual quadrangle (VT) may be identical to that of the second side V2 thereof.

As such, the center of the first opening OM1 coincides with the first apex P1, the center of the second opening OM2 coincides with the second apex P2, and the centers of the third openings OM3 coincide with the third and fourth apexes P3 and P4, so the first opening OM1, the second opening OM2, and the plurality of third openings OM3 are disposed to surround the center point CP on the virtual quadrangle (VT). The first organic emission layer OL1 is disposed on the first electrode E1 in accordance with the first opening OM1.

For example, the first organic emission layer OL1 includes an organic material that emits red light, and as a result emits red light. In another example, the first organic emission layer OL1 may include an organic material that emits red, blue, or white light, and in this case, emits red, blue, or white light.

The second organic emission layer OL2 is disposed on the second electrode E2 in accordance with the second opening OM2. For example, the second organic emission layer OL2 includes an organic material that emits blue light, and as a result emits blue light. In another example, the second organic emission layer OL2 includes an organic material that emits red, green, or white light, and in this case, emits red, green, or white light.

The third organic emission layers OL3 are disposed on the third and fourth electrodes E3 and E4 in accordance with the third openings OM3. For example, the third organic emission layer OL3 includes an organic material that emits green light, and as a result emits green light. In another example, the third organic emission layer OL3 may include an organic material that emits blue, green, or white light, and in this case, emits blue, green, or white light.

That is, the first, second, and third organic emission layers OL1, OL2, and OL3 described above respectively emit light of different colors.

The common electrode CE is disposed on the first, second, and third organic emission layers OL1, OL2, and OL3 across an entire surface of the first substrate SU1, with each being a cathode functioning as an electron injection electrode or an anode. The common electrode CE may be formed as a light transmissive electrode or a light reflective electrode. For example, as illustrated in FIG. 2, the common electrode CE is disposed on the spacers SP. In another example, the common electrode CE may be disposed between the pixel definition layer PDL and the spacer SP.

The second substrate SU2 is formed as an insulating substrate that is made of, e.g., glass, quartz, ceramic, metal, and plastic. In the current exemplary embodiment, the second substrate SU2 may be formed of a thin film encapsulation layer in which a plurality of organic and inorganic layers are alternately laminated. In addition, when the second substrate SU2, along with the first substrate SU1, is made of plastic and the like, the OLED display may have may a flexible, stretchable, or rollable property. In addition, a functional layer, e.g., a capping layer (CPL), lithium fluoride (LiF), or the like may be added between the common electrode CE and the second substrate SU2.

As illustrated in FIG. 1 (bottom right of figure), in the OLED display 100 according to the exemplary embodiment, a gap, i.e., distance, of a first length L1 is formed between the first opening OM1 and the second opening OM2, a gap of a second length L2 is formed between the first opening OM1 and the third opening OM3, and a gap of a third length L3 is formed between the second opening OM2 and the third opening OM3. Therefore, deposition reliability improves when performing a mask deposition process for forming each of red, blue, and green organic emission layers that are included in the first, second, and third openings OM1, OM2, and OM3. That is, the OLED display 100 with improved deposition reliability is provided.

In addition, in the OLED display 100 according to the exemplary embodiment, the first opening OM1, the second opening OM2, and the pair of third openings OM3 are respectively arranged to surround the center point CP of the virtual quadrangle (VT), and an aperture ratio of each of the first, second, and third openings OM1, OM2, and OM3 may be improved. This serves as a factor for improving an overall manufacturing time and cost of the OLED display 100, as well as for enhancing quality of an image that the OLED display 100 displays. That is, the OLED display 100 with improved image quality is provided.

In addition, in the OLED display 100 according to the exemplary embodiment, since the second opening OM2 of the first, second, and third openings OM1, OM2, and OM3, which emits blue light that has a shorter wavelength than other pixels, has a larger size than the first and third openings OM1 and OM3, the overall lifespan of the OLED display 100 is prevented from being shortened. That is, the OLED display 100 with an improved lifespan is provided.

The two or more spacers SP are disposed on the center point CP of the virtual quadrangle (VT) or on the vicinity of the center point CP. For example, as illustrated in FIG. 1, four spacers SP may be arranged to have the center point CP in a center thereof. The spacers SP are formed to protrude in an island-like shape on the pixel definition layer PDL, as illustrated in FIG. 2, and are disposed to be surrounded by the electrode portion E0, as illustrated in FIG. 1, e.g., the spacers SP may be surrounded by the first, second, third, and fourth electrodes E1, E2, E3, and E4. The two or more spacers SP may comprises two types of spacers; a connected spacer SPC and a separated spacer SPS. The connected spacer SPC may be configured such that their lower end portions contacting the pixel definition layer PDL are connected to each other, as illustrated on the left side of FIG. 2. The separated spacer SPS may be configured such that their lower end portions contacting the pixel definition layer PDL are separated from each other, as illustrated on the right side of FIG. 2. The spacers SP may be respectively made of the same material or different materials as the pixel definition layer PDL, and may include one or more of an organic material, an inorganic material, a metal, glass, and the like.

For example, as shown in FIG. 1, the four spacers SP may be formed to have triangular planar shapes (in top view), widths of which respectively increase closer to the first opening OM1, the second opening OM2, and the pair of third openings OM3 from the center point CP. However, the scope of the exemplary embodiment is not necessarily limited to the shapes, numbers, and arrangements of the spacers described above, so the spacers may be designed in various shapes, numbers and arrangements.

Arrangements of two or more spacers SP according to an exemplary embodiment will now be described with reference to FIGS. 3 to 6.

FIGS. 3 to 6 illustrate various arrangements of spacers in an OLED display according to exemplary embodiments.

Figure 3:
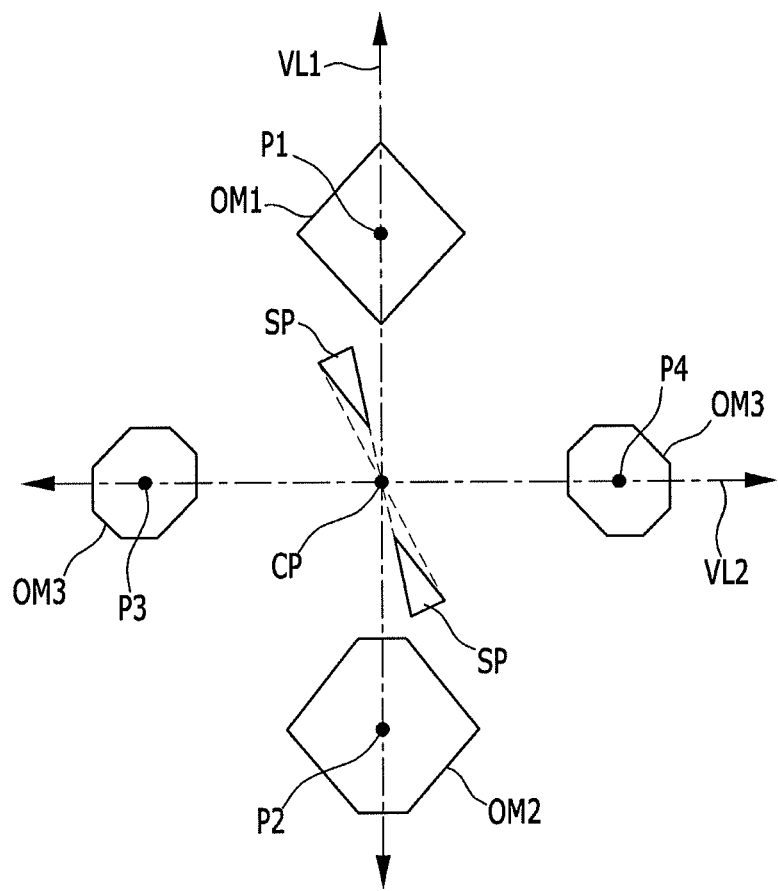
FIGS. 3 to 6 illustrate various arrangements of spacers of an OLED display according to an exemplary embodiment.

For example, referring to FIG. 3, in an OLED display according to an embodiment, two spacers SP of a triangular planar shape may be disposed to be symmetrical to each other based on a center point CP of a virtual quadrangle (VT). For example, the spacers may not be aligned with any of the first, second, or third openings OM1, OM2, or OM3.

Figure 4:
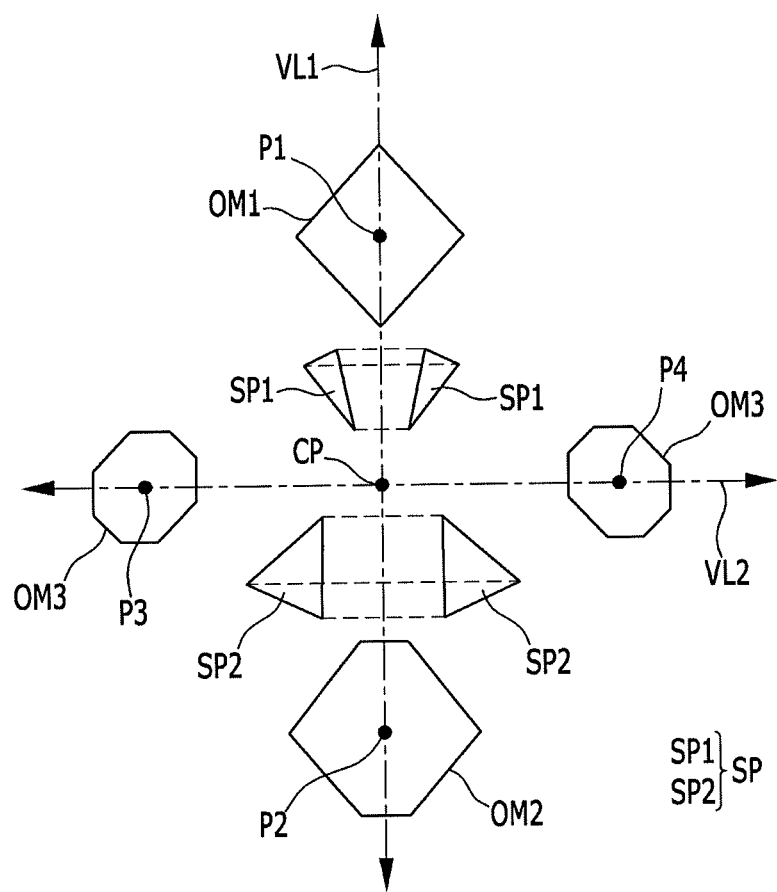

In another example, referring to FIG. 4, the spacers SP may include a pair of first spacers SP1 and a pair of second spacers SP2. The pairs of first and second spacers SP1 and SP2 may be disposed to be symmetrical to each other based on the first imaginary line VL1 that connects first and second apexes P1 and P2.

Figure 5:
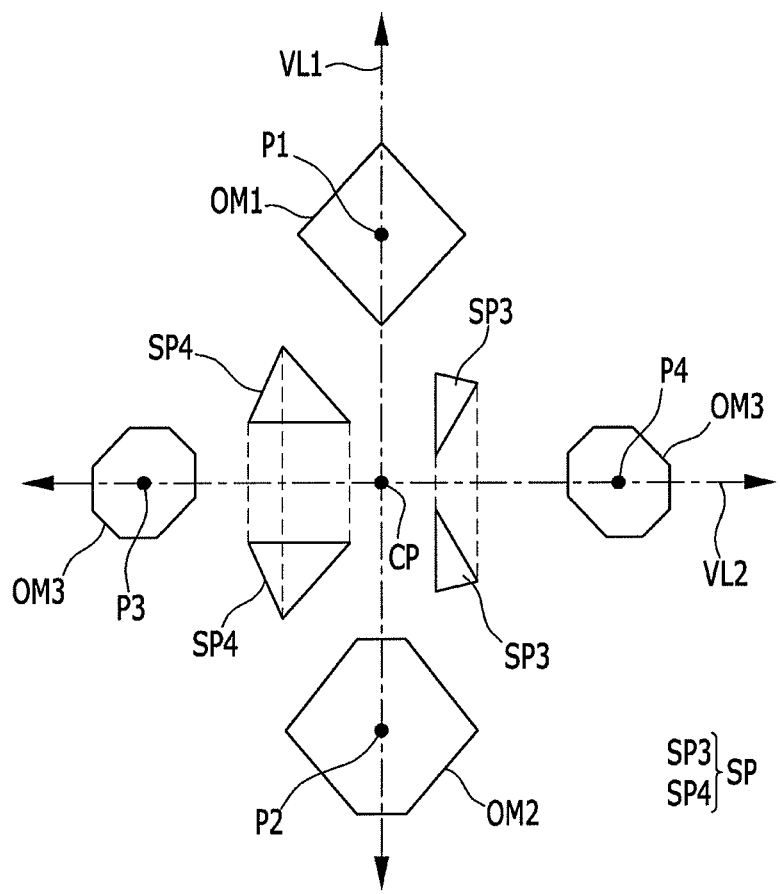

In yet another example, referring to FIG. 5, the spacers SP may include third and fourth spacers SP3 and SP4, each of which is formed as a pair. The pairs of the third and fourth spacers SP3 and SP4 may be disposed to be symmetrical to each other based on the second imaginary line VL2 that connects third and fourth apexes P3 and P4.

Figure 6:
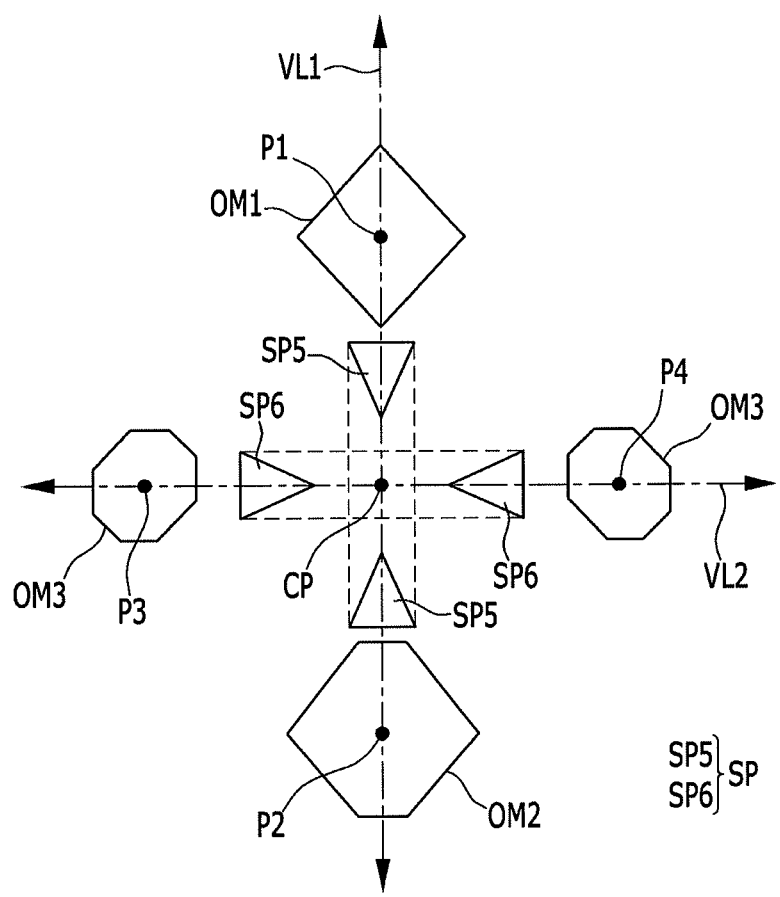

In still another example, referring to FIG. 6, the spacers SP may include fifth and sixth spacers SP5 and SP6, each of which is formed as a pair. Each of the pairs of the fifth and sixth spacers SP5 and SP6 is arranged to be symmetrical to each other based on the first imaginary line VL1, the second imaginary line VL2, and the center point CP.

As described above, in the exemplary embodiments, examples in which two or more spacers SP are disposed to be symmetrical to each other based on the center point CP of the virtual quadrangle (VT), the first imaginary line VL1, and/or the second imaginary line VL2 are described, but the specific arrangements of the spacers SP are not limited to the scope described above. An example in which the two or more spacers SP are disposed on the center point CP or disposed to be symmetrical to none of the center point CP, the first imaginary line VL1, and the second imaginary line VL2 may also be possible.

Spacers of various shapes in an OLED display according to an exemplary embodiment will now be described with reference to FIGS. 7 to 10.

FIGS. 7 to 10 illustrate spacers of various shapes in the OLED display according to the exemplary embodiment.

Figure 7:
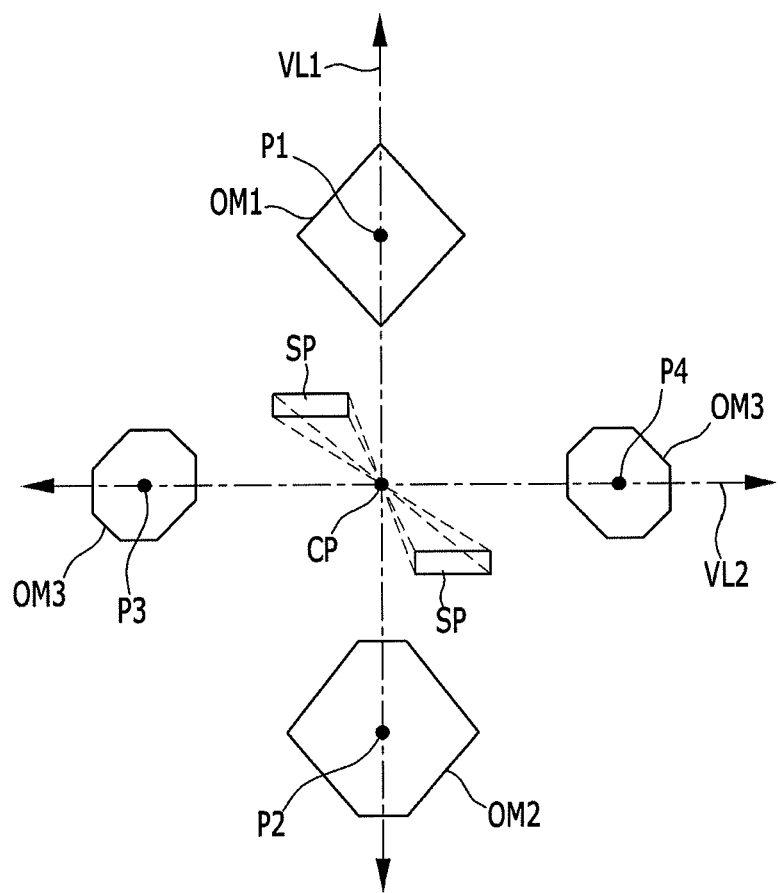
FIGS. 7 to 10 illustrate various shapes of the spacers of an OLED display according to an exemplary embodiment.
Figure 8:
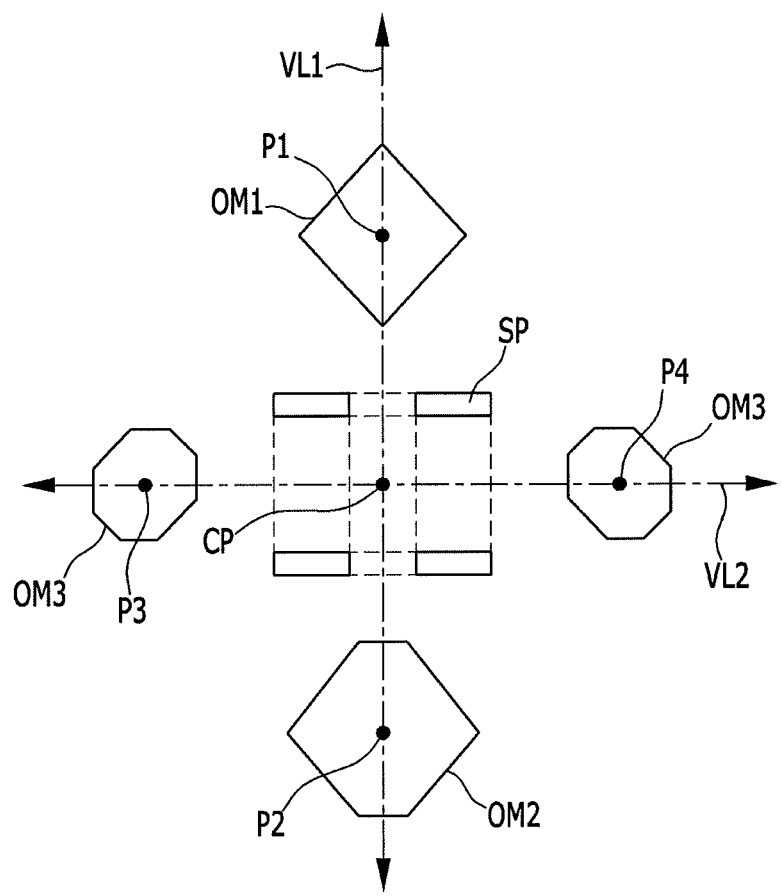

For example, referring to FIGS. 7-8, the spacers SP may be formed to have a planar bar shape. In the exemplary embodiment, two spacers SP of the planar bar shape disposed to be symmetrical to each other based on the center point CP (FIG. 7) or four spacers SP of the planar bar shape respectively disposed to be symmetrical to each other based on first and second imaginary lines VL1 and VL2 (FIG. 8) are formed, but they are not necessarily limited thereto.

Figure 9:
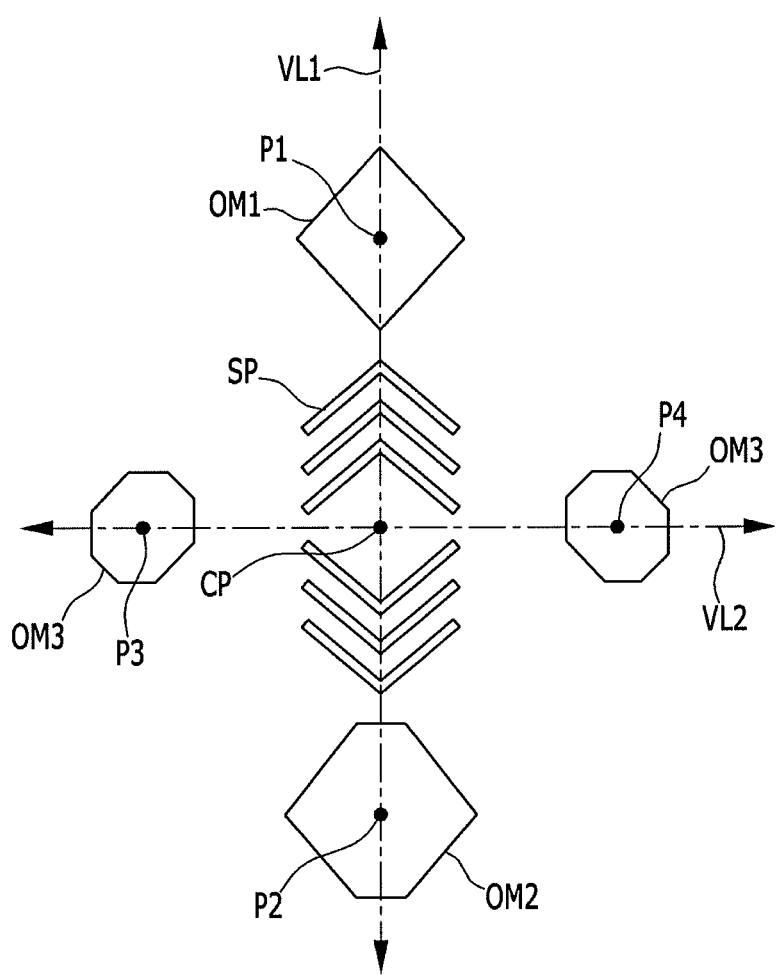
Figure 10:
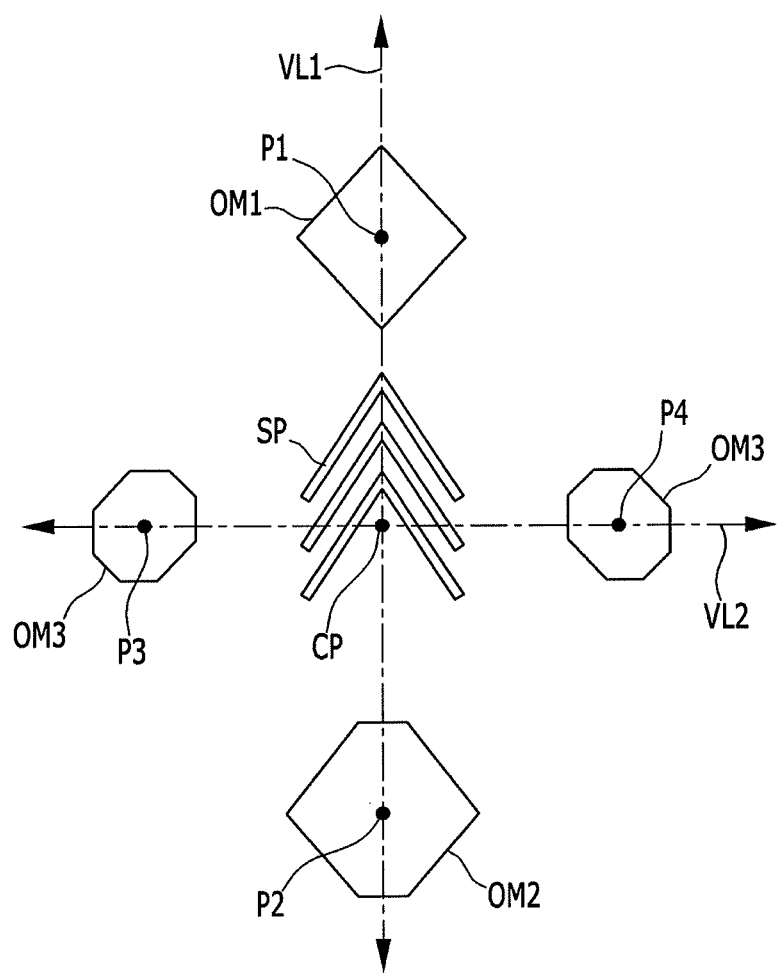

In another example, referring to FIGS. 9-10, the spacers SP may be formed to have a planar comb-like pattern. The pattern of the spacers SP may be formed to extend, as illustrated in FIG. 9, in opposite directions based on the second imaginary line VL2, or to extend along a direction in which the first imaginary line VL1 extends (FIG. 10). That is, the spacers SP of the bar shape or the comb-like pattern may also be disposed to be symmetrical to each other, as described above, based on at least any one of the center point CP, the first imaginary line VL1, and the second imaginary line VL2.

As such, in the OLED display according to the current exemplary embodiment, the two or more spacers SP having a relatively smaller size than a general spacer are formed to have an island-like shape, such that a contact area between upper end portions of the spacers SP and a mask can be minimized when performing a subsequent mask process for forming a common electrode layer, a functional layer, and a thin film encapsulation layer. Therefore, defects of the spacers SP due to the mask, e.g., a dent and the like, can be minimized. That is, the OLED display according to example embodiments may have spacers with minimized dent defects.

In addition, in the OLED display according to the exemplary embodiments, the two or more spacers SP designed to have the various planar shapes can be disposed to be symmetrical to each other based on any one of the center point CP, the first imaginary line VL1, and the second imaginary line VL2, so the mask can be stably supported, e.g., properly balanced, without being inclined to any one side. That is, when performing the mask process, the OLED display with the mask is stably supported.

By way of summation and review, a conventional OLED display may include spacers on a pixel definition layer to minimize interference due to a second substrate by increasing an interval between an organic emission layer and the second substrate. However, in the conventional OLED display, when a subsequent mask process, e.g., for forming a functional layer, a thin film encapsulation layer, and the like, is performed, the spacers' end portions may contact the mask, thereby causing dent defects. As such, a deposited inorganic barrier layer gets damaged and allows moisture, gas, and the like to permeate into the organic emission layer through damaged parts of the inorganic barrier layer, thereby generating pixel defects, e.g., dark spots and the like, due to the dent defects in the spacers.

In contrast, example embodiments provide an organic light emitting diode (OLED) display in which a contact area between spacers disposed on a pixel definition layer and a mask is minimized to have the least amount of dent defects to the spacers. That is, according to one of the exemplary embodiments, the provided OLED display minimizes not only the interference of the substrate for the organic emission layer, but also the contact area between the spacer and the mask when performing the subsequent mask process, such as the thin film encapsulation process and the like, by increasing the ratio of the area where the spacers are disposed to the entire area and disposing the two or more spacers having the small upper contact areas, in consideration of the shape of the opening included in pixel the definition layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
    two or more spacers on a substrate, the two or more spacers being arranged at least at either one of a center point of a virtual quadrangle or a vicinity of the center point of the virtual quadrangle;
    an electrode portion at each apex of the virtual quadrangle, four electrode portions spaced apart from each other defining the virtual quadrangle, the four electrode portions being directly adjacent to each other and surrounding the two or more spacers; and
    a pixel definition layer on the electrode portion, the pixel definition layer including exposing the electrode portion.

2. The OLED display as claimed in claim 1, wherein the electrode portion includes:
    a first electrode positioned at a first apex of the virtual quadrangle;
    a second electrode positioned at a second apex of the virtual quadrangle, the second apex being separated from the first apex, and the center point of the virtual quadrangle being between the first and second apexes;
    a third electrode positioned at a third apex of the virtual quadrangle; and
    a fourth electrode positioned at a fourth apex of the virtual quadrangle, the fourth apex being separated from the third apex, and the center point of the virtual quadrangle being between the third and fourth apexes.

3. The OLED display as claimed in claim 2, wherein the two or more spacers are symmetrical to each other based on a first imaginary line that connects the first apex and the second apex.

4. The OLED display as claimed in claim 2, wherein the two or more spacers are symmetrical to each other based on a second imaginary line that connects the third apex and the fourth apex.

5. An organic light emitting diode (OLED) display, comprising:
- two or more spacers on a substrate, the two or more spacers being arranged at least at either one of a center point of a virtual quadrangle or a vicinity of the center point of the virtual quadrangle;
- an electrode portion at each apex of the virtual quadrangle, the electrode portion surrounding the two or more spacers; and
- a pixel definition layer on the electrode portion, the pixel definition layer including exposing the electrode portion,
- wherein the electrode portion includes:
  - a first electrode positioned at a first apex of the virtual quadrangle,
  - a second electrode positioned at a second apex of the virtual quadrangle, the second apex being separated from the first apex, and the center point of the virtual quadrangle being between the first and second apexes,
  - a third electrode positioned at a third apex of the virtual quadrangle, and
  - a fourth electrode positioned at a fourth apex of the virtual quadrangle, the fourth apex being separated from the third apex, and the center point of the virtual quadrangle being between the third and fourth apexes, and
- wherein the pixel definition layer includes:
  - a first opening of a first polygonal shape exposing the first electrode and having a center coinciding with the first apex;
  - a second opening of a second polygonal shape exposing the second electrode and having a center coinciding with the second apex; and
  - a pair of third openings of a third polygonal shape respectively exposing the third and fourth electrodes and having centers coinciding with the third apex and the fourth apex.

6. The OLED display as claimed in claim 5, wherein the first and second openings have larger sizes than the pair of third openings.

7. The OLED display as claimed in claim 6, wherein the second opening has a larger size than the first opening.

8. The OLED display as claimed in claim 7, wherein one or more of the first, second, and third polygonal shapes is an octagon.

9. The OLED display as claimed in claim 7, wherein either one of the first polygonal shape and the second polygonal shape is a quadrangle, the other is a hexagon, and the third polygonal shape is an octagon.

10. The OLED display as claimed in claim 9, wherein a plurality of first openings are provided, neighboring ones of the plurality of first openings have quadrangular shapes that are symmetrical to each other.

11. The OLED display as claimed in claim 10, wherein a distance between the first and second openings is identical to that between neighboring third openings.

12. The OLED display as claimed in claim 11, wherein a distance between the first opening and either one of the pair of third openings is identical to that between the second opening and either one of the pair of third openings.

13. The OLED display as claimed in claim 5, further comprising:
- a first organic emission layer on the first electrode in accordance with the first opening;
- a second organic emission layer on the second opening in accordance with the second electrode; and
- a pair of third organic emission layers respectively on the third and fourth electrodes in accordance with the pair of third openings.

14. The OLED display as claimed in claim 13, wherein the first organic emission layer, the second organic emission layer, and the pair of third organic emission layers emit light of different colors.

15. The OLED display as claimed in claim 14, wherein either one of the first organic emission layer and the second organic emission layer emits red light, the other emits blue light, and the pair of third organic emission layers emit green light.

16. The OLED display as claimed in claim 1, wherein the two or more spacers protrude in an island-like shape from the pixel definition layer.

17. The OLED display as claimed in claim 16, wherein each of the two or more spacers has a planar bar shape.

18. The OLED display as claimed in claim 16, wherein each of the two or more spacers has a triangular planar shape.

19. The OLED display as claimed in claim 16, wherein each of the two or more spacers has a planar shape with a comb-like pattern.

20. An organic light emitting diode (OLED) display, comprising:
- two or more spacers on a substrate, the two or more spacers being arranged at least at either one of a center point of a virtual quadrangle or a vicinity of the center point of the virtual quadrangle;
- an electrode portion at each apex of the virtual quadrangle, the electrode portion surrounding the two or more spacers; and
- a pixel definition layer on the electrode portion, the pixel definition layer including exposing the electrode portion,
- wherein the two or more spacers are symmetrical to each other based on the center point of the virtual quadrangle.

* * * * *